United States Patent
Hayashi

(10) Patent No.: US 9,633,933 B2
(45) Date of Patent: Apr. 25, 2017

(54) LEAD FRAME WITH ANCHOR-SHAPED LEAD

(71) Applicant: Shinko Electric Industries Co., Ltd., Nagano-ken (JP)

(72) Inventor: Shintaro Hayashi, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/791,630

(22) Filed: Jul. 6, 2015

(65) Prior Publication Data

US 2016/0013120 A1    Jan. 14, 2016

(30) Foreign Application Priority Data

Jul. 9, 2014  (JP) ................................ 2014-141584

(51) Int. Cl.
    *H01L 23/495*    (2006.01)
    *H01L 23/31*     (2006.01)
    *H01L 21/48*     (2006.01)

(52) U.S. Cl.
    CPC .... *H01L 23/49551* (2013.01); *H01L 21/4842* (2013.01); *H01L 23/3107* (2013.01); *H01L 2224/48091* (2013.01); *H01L 2224/48247* (2013.01); *H01L 2924/181* (2013.01)

(58) Field of Classification Search
    CPC . H01L 23/495; H01L 23/31; H01L 23/49503; H01L 23/49551; H01L 23/4952; H01L 23/3137
    USPC ........ 257/676, 666, 684, 784, 786, 696, 698
    See application file for complete search history.

(56) References Cited

U.S. PATENT DOCUMENTS

| | | | | |
|---|---|---|---|---|
| 5,291,059 A | * | 3/1994 | Ishitsuka ............. | H01L 21/4821 257/666 |
| 5,835,988 A | * | 11/1998 | Ishii ................... | H01L 23/3107 257/666 |
| 6,201,294 B1 | * | 3/2001 | Lee ................... | H01L 23/49537 257/669 |
| 6,320,251 B1 | * | 11/2001 | Glenn ................. | H01L 23/3107 257/678 |
| 6,329,705 B1 | * | 12/2001 | Ahmad ................. | H01L 23/16 257/666 |
| 8,395,251 B2 | * | 3/2013 | Shim ................... | H01L 23/3107 257/666 |

(Continued)

FOREIGN PATENT DOCUMENTS

| JP | 2003-309241 | 10/2003 |
|---|---|---|
| JP | 2003-309242 | 10/2003 |

*Primary Examiner* — Alexander Oscar Williams
(74) *Attorney, Agent, or Firm* — Fish & Richardson P.C.

(57) ABSTRACT

A lead frame includes a die pad and a plurality of leads arranged around the die pad. Each of the leads includes an inner lead, a bent portion, and an external connection terminal. The inner lead includes a distal portion, adjacent to the die pad, and a connection end portion, located at an opposite end of the inner lead from the distal portion. The bent portion is connected to the connection end portion of the inner lead. The external connection terminal is connected by the bent portion to the connection end portion of the inner lead and located below the inner lead. The external connection terminal includes an upper surface that faces to and is parallel to a lower surface of the inner lead. The inner lead, the bent portion, and the external connection terminal are formed integrally in each of the leads.

4 Claims, 15 Drawing Sheets

(56) References Cited

U.S. PATENT DOCUMENTS

| | | | |
|---|---|---|---|
| 9,355,945 B1* | 5/2016 | Ge | H01L 23/49568 |
| 2002/0027273 A1* | 3/2002 | Huang | H01L 23/3107 |
| | | | 257/678 |
| 2002/0167074 A1* | 11/2002 | Kim | H01L 23/49555 |
| | | | 257/666 |
| 2003/0038361 A1* | 2/2003 | Nakamura | H01L 21/565 |
| | | | 257/696 |
| 2003/0062601 A1* | 4/2003 | Harnden | H01L 23/3107 |
| | | | 257/666 |
| 2005/0093177 A1* | 5/2005 | Liu | H01L 23/49551 |
| | | | 257/786 |
| 2005/0104168 A1* | 5/2005 | Choi | H01L 23/315 |
| | | | 257/666 |
| 2009/0072363 A1* | 3/2009 | Camacho | H01L 23/3135 |
| | | | 257/676 |

* cited by examiner (Related Art)

LEAD FRAME WITH ANCHOR-SHAPED LEAD

CROSS-REFERENCE TO RELATED APPLICATIONS

This application is based upon and claims the benefit of priority from prior Japanese Patent Applications No. 2014-141584, filed on Jul. 9, 2014, the entire contents of which are incorporated herein by reference.

FIELD

This disclosure relates to a lead frame, a semiconductor device, and a method for manufacturing a lead frame.

BACKGROUND

To cope with recent electronic devices that are reduced in size and have high density, there is a demand for high-performance and high-density semiconductor components. Thus, semiconductor devices (semiconductor packages) are being reduced in size and weight at a high pace. In such a trend, there are leadless semiconductor devices (leadless packages), which have no leads extending to the outside, such as, a quad flat non-leaded package (QFN package) and a small outline non-leaded package (SON package) (e.g., refer to Japanese Laid-Open Patent Publication Nos. 2003-309241 and 2003-309242).

FIG. 22 is a cross-sectional view illustrating one example of a leadless semiconductor device 90.

In the semiconductor device 90, a semiconductor element 92 is mounted on a die pad 91, and the semiconductor element 92 and leads 93 are electrically connected by metal wires 94. Each lead 93 includes an upper surface electrically connected to the semiconductor element 92 and a lower surface (reverse surface) connected to a motherboard or the like. In the lead 93, the upper surface is wider than the lower surface. More specifically, the lead 93 has the form of a step. In other words, each lead 93 includes a thin distal portion 93A. In the semiconductor device 90, an encapsulation resin 95 encapsulates the semiconductor element 92, the metal wires 94, and the distal portions 93A of the leads 93. The encapsulation resin 95 extends into the lower side of the distal portion 93A of each lead 93 so that the gap between the lead 93 and the die pad 91 is filled with the encapsulation resin 95. This produces an anchor effect that limits dropout of the leads 93 from the encapsulation resin 95. In this manner, the thin distal portions 93A of the leads 93 caught in the encapsulation resin 95 each have the form of an anchor and limit the dropout of the leads 93.

In the semiconductor device 90, the reverse surface of each lead 93, which is exposed from the encapsulation resin 95, functions as an external connection terminal.

SUMMARY

The leads may have the above form of an anchor, for example, by thinning a metal plate through wet etching (half etching). However, the wet-etching of a metal plate increases the manufacturing cost and decreases the processing speed. Thus, it is desirable that an anchor be pressed and shaped by a die. This decreases the manufacturing cost and increases the processing speed. However, when a lead undergoes a pressing process that forms, for example, a crushed portion (shape of an anchor) in a distal end of the lead, a large stress is applied to the lead. Thus, the lead has a tendency to easily deform.

One aspect of this disclosure is a lead frame including a die pad and a plurality of leads arranged around the die pad. Each of the leads includes an inner lead, a bent portion, and an external connection terminal. The inner lead includes a distal portion, adjacent to the die pad, and a connection end portion, located at an opposite end of the inner lead from the distal portion. The bent portion is connected to the connection end portion of the inner lead. The external connection terminal is connected by the bent portion to the connection end portion of the inner lead and located below the inner lead. The external connection terminal includes an upper surface that faces to and is parallel to a lower surface of the inner lead. The inner lead, the bent portion, and the external connection terminal are formed integrally in each of the leads.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 6A is a bottom view of the structure illustrated in FIG. 6B;

DESCRIPTION OF THE EMBODIMENTS

Figure 1:
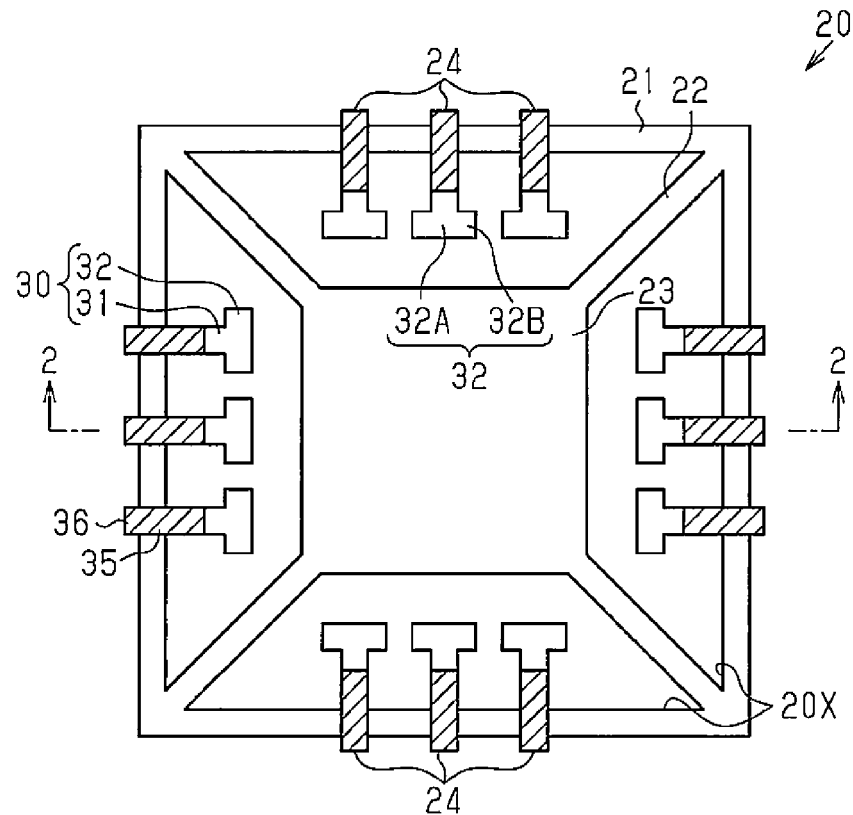
FIG. 1 is a schematic bottom view of a first embodiment of a lead frame illustrating the lead frame of FIG. 2 as viewed from below.

Each embodiment will now be described with reference to the drawings. Elements in the drawings are illustrated for simplicity and clarity and have not necessarily been drawn to scale. To facilitate understanding, hatching lines may not be illustrated or be replaced by shadings in the cross-sectional drawings.

First Embodiment

A first embodiment will now be described with reference to FIGS. 1 to 7B. FIG. 1 illustrates a lead frame 20, which is used as a substrate for a QFN package.

The lead frame 20 includes a dambar 21, support bars 22, a die pad 23, and leads 24. The material of the dambar 21, the support bars 22, the die pad 23, and the leads 24 may be, for example, copper (Cu), a Cu-based alloy, iron-nickel (Fe—Ni), or an Fe—Ni-based alloy.

For example, the dambar 21 has the form of a tetragonal frame in a plan view. The die pad 23, on which a semiconductor element 41 (refer to FIG. 3) is mounted, is located in a central portion of a region surrounded by the dambar 21. The die pad 23 is supported by four support bars 22 respectively extending from the four corners of the dambar 21. In other words, the dambar 21 and the support bars 22 function as a frame that supports the die pad 23. The die pad 23 is tetragonal in a plan view.

The leads 24 surround the die pad 23. The leads 24 are separated from the die pad 23. For example, the leads 24 are laid out in a comb teeth-like arrangement and extend from the dambar 21 toward the die pad 23.

Figure 2:
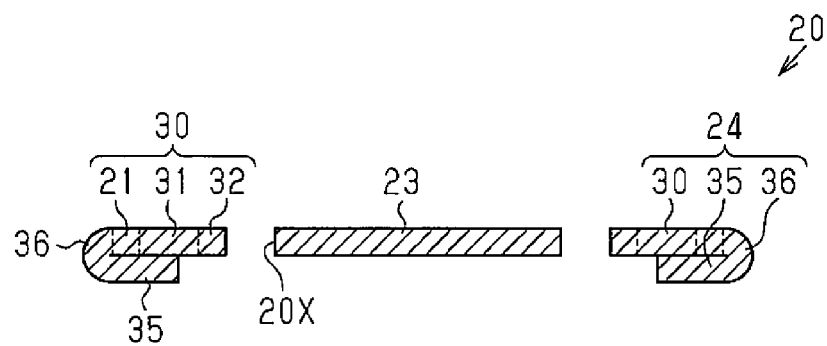
FIG. 2 is a schematic cross-sectional view of the lead frame taken along line 2-2 in FIG. 1.

As illustrated in FIG. 2, each lead 24 includes an inner lead 30 and an external connection terminal 35. The inner lead 30 is electrically connected to an electrode terminal of the semiconductor element 41 mounted on the die pad 23 (refer to FIG. 3). The external connection terminal 35 is electrically connected to a wire of a mounting board, such as, a motherboard. Each lead 24 also includes a bent portion 36. The bent portion 36 includes one end connected to the inner lead 30 and the other end connected to the external connection terminal 35. The inner lead 30, the external connection terminal 35, and the bent portion 36 are formed integrally.

As illustrated in FIGS. 1 and 2, each inner lead 30 is, for example, generally T-shaped in a plan view. Each inner lead 30 includes a portion of the dambar 21, an extension 31 extending from the portion of the dambar 21 toward the die pad 23, and a distal portion 32. The distal portion 32 is adjacent to the die pad 23 and wider than the extension 31. As illustrated in FIG. 1, each distal portion 32 includes a central part 32A extending from a distal end of the corresponding extension 31 toward the die pad 23 and a projection 32B projecting from two laterally opposite ends of the central part 32A in the widthwise direction of the corresponding inner lead 30.

As illustrated in FIG. 2, each inner lead 30 includes a connection end portion at an opposite end of the inner lead 30 from the distal portion 32. The connection end portion is connected to the corresponding bent portion 36. In the present example, a portion of the dambar 21 functions as the connection end portion of each inner lead 30, and each bent portion 36 is connected to an outer end surface of the dambar 21 (connection end portion).

Each bent portion 36 is formed by bending a portion of the lead 24 by approximately 180 degrees. For example, the bent portion 36 is generally U-shaped in a cross-sectional view. Thus, the outer surface of the bent portion 36 is curved.

Each external connection terminal 35 includes an upper surface, which faces to and is parallel to a lower surface of the corresponding inner lead 30. For example, the upper surface of the external connection terminal 35 is overlapped with the lower surface of the inner lead 30. For example, the upper surface of the external connection terminal 35 is in planar contact with the lower surface of the inner lead 30. In the present example, the upper surface of each external connection terminal 35 is overlapped and in planar contact with the lower surface of the corresponding inner lead 30 over a range from the connection end portion of the inner lead 30 to a longitudinally intermediate portion of the inner lead 30 (extension 31). In other words, in the longitudinal direction, the external connection terminal 35 is set to be shorter than the inner lead 30. Thus, the lower surface of the inner lead 30 is partially exposed from the external connection terminal 35. For example, in the lower surface of the inner lead 30, at least the lower surface of the distal portion 32 is exposed from the external connection terminal 35.

In this manner, each lead 24 is folded downward from the connection end portion of the corresponding inner lead 30. Consequently, the upper surface of the external connection terminal 35 is overlapped with the lower surface of the inner lead 30. Thus, as illustrated in FIG. 2, the external connection terminal 35 has the same thickness as the inner lead 30. Also, as illustrated in FIG. 1, the external connection terminal 35 has the same length as the extension 31 in the widthwise direction (direction orthogonal to the longitudinal direction of the external connection terminal 35). The thickness of each inner lead 30 and each external connection terminal 35 may be set to be, for example, approximately 0.1 to 0.2 mm. The width (length in the widthwise direction) of each inner lead 30 and each external connection terminal 35 may be set to be, for example, approximately 0.1 mm. The longitudinal length of each inner lead 30 may be set to be, for example, approximately 1.0 mm. The longitudinal length of each external connection terminal 35 may be set to be, for example, approximately 0.4 mm.

The die pad 23 is, for example, tetragonal in a cross-sectional view. For example, the die pad 23 is formed on substantially the same plane as the inner leads 30. Thus, the die pad 23 is located at a higher position than the external connection terminals 35.

As illustrated in FIG. 1, the lead frame 20 includes openings 20X. The openings 20X define the dambar 21, the support bars 22, the die pad 23, and the leads 24. The openings 20X each extend through the lead frame 20 in the thicknesswise direction. In FIG. 1, the hatched lines depict the region of each lead 24 that is folded and overlapped in two layers.

Figure 3:
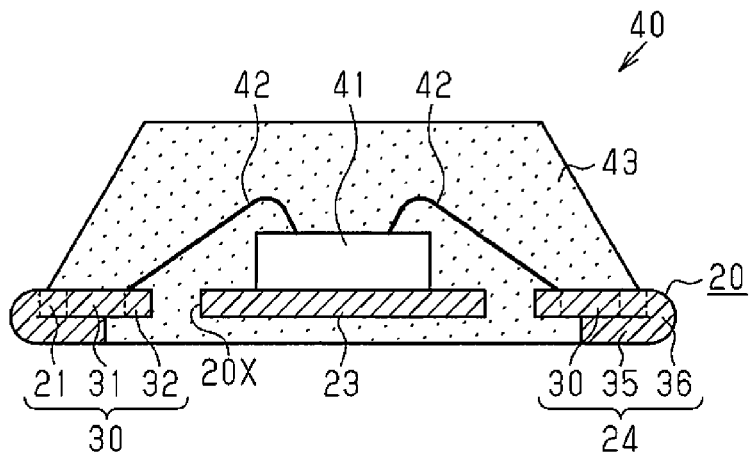
FIG. 3 is a schematic cross-sectional view illustrating a semiconductor device including the lead frame of FIG. 1.

The semiconductor device 40 will now be described with reference to FIG. 3. The semiconductor device 40 is of QFN type. The semiconductor device 40 has the structure of a QFN package including the lead frame 20.

The semiconductor element 41 is mounted on the die pad 23 of the lead frame 20. The electrode terminals of the semiconductor element 41 are connected to the inner leads 30 by metal wires 42, respectively.

The encapsulation resin 43 is formed on the inner leads 30 and the die pad 23 to encapsulate the semiconductor element 41 and the metal wires 42. Also, the openings 20X of the lead frame 20 are filled with the encapsulation resin 43. The encapsulation resin 43 covers side surfaces of each inner lead 30, the lower surface of each inner lead 30 exposed from the corresponding external connection terminal 35, and side surfaces of each external connection terminal 35. Further, the encapsulation resin 43 covers the entire surface of the distal portion 32 of each inner lead 30. Thus, the distal portion 32 of each inner lead 30 is caught in the encapsulation resin 43. In this manner, each lead 24 is bent downward so that the distal portion 32 of the inner lead 30 is exposed from the external connection terminal 35. Thus, each distal portion 32, which is caught in the encapsulation resin 43, has the form of an anchor, which limits dropout of the corresponding lead 24.

In the semiconductor device 40, the lower surface of each external connection terminal 35 is exposed from the encapsulation resin 43. The lower surface of the external connection terminal 35, which is exposed from the encapsulation resin 43, is electrically connected by a solder or the like to a wire of the mounting board, such as, a motherboard. For example, the encapsulation resin 43 includes a lower surface that is generally flush with the lower surface of the external connection terminal 35. Additionally, for example, the bent portion 36 of each lead 24 is exposed from the encapsulation resin 43.

The semiconductor element 41 is, for example, an IC chip or an LSI chip. Each metal wire 42 may be, for example, a fine wire formed from gold (Au), aluminum (Al), or the like. The material of the encapsulation resin 43 may be, for example, an insulative resin, such as, an epoxy resin, a polyimide resin, a phenol resin, or a polyvinyl chloride resin.

Although not illustrated in the drawings, the dambar 21 is cut apart at certain locations to separate adjacent leads 24. Thus, the leads 24 are electrically isolated from one another.

The process for manufacturing the lead frame 20 will now be described.

Figure 4:
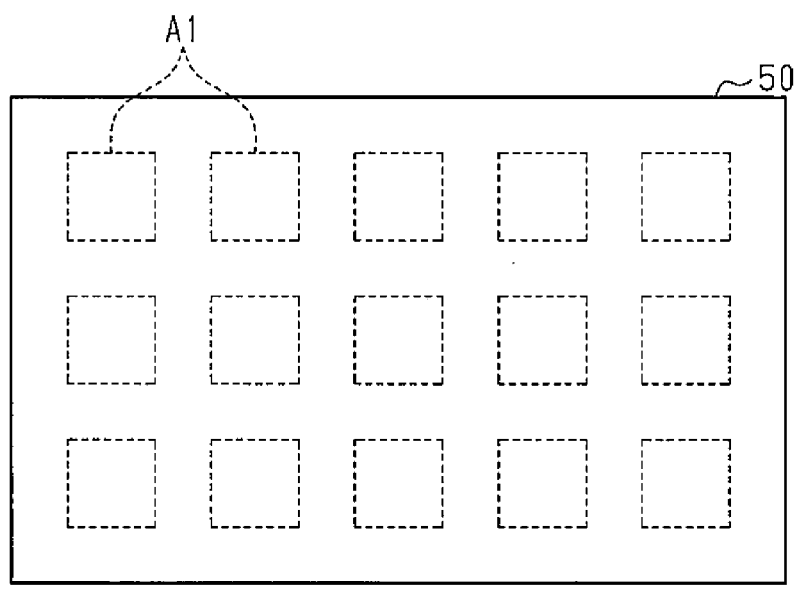
FIG. 4 is a schematic plan view illustrating a process for manufacturing the lead frame illustrated in FIG. 1.

As illustrated in FIG. 4, a metal plate 50 is prepared. The metal plate 50 is, for example, tetragonal in a plan view. The metal plate 50 includes a plurality of individual regions A1 arranged in a matrix (here, 3×5). The individual regions A1 are separated from one another at predetermined intervals. The lead frame 20 is formed in each individual region A1. After the semiconductor element 41 is mounted on each individual region A1, the metal plate 50 is ultimately cut along the broken lines (each individual region A1) and singulated into individual semiconductor devices 40. The metal plate 50 may be formed, for example, from Cu, a Cu-based alloy, Fe—Ni, an Fe—Ni-based alloy, or the like. The thickness of the metal plate 50 may be set to be, for example, approximately 0.2 mm.

Although FIG. 4 illustrates an example of the metal plate 50 having fifteen individual regions A1, the number of the individual regions A1 is not particularly limited. Hereinafter, for the sake of brevity, the description will focus on a single individual region A1.

Figure 5A:
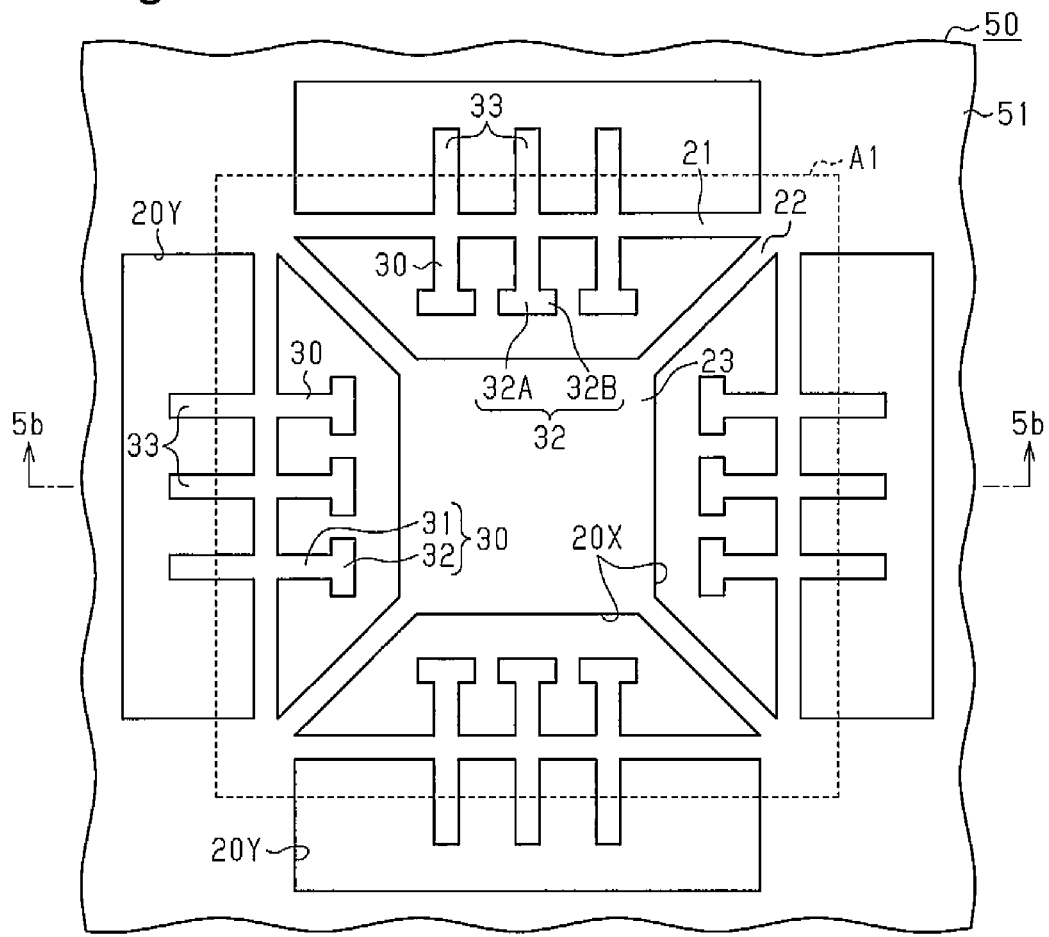
FIG. 5A is a schematic plan view illustrating the process for manufacturing a lead frame.
Figure 5B:
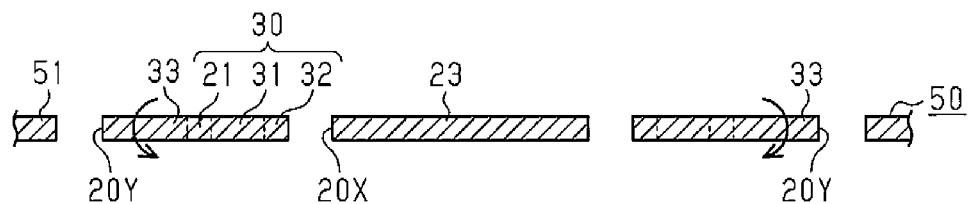
FIG. 5B is a schematic cross-sectional view of the lead frame taken along line 5b-5b in FIG. 5A.

In the step illustrated in FIG. 5A, the openings 20X are formed in each individual region A1 of the metal plate 50. The openings 20X define the dambar 21, the support bars 22 (illustrated in only FIG. 5A), the die pad 23, and the inner leads 30. The dambar 21 and the support bars 22 are connected to an outer frame 51, which is located between adjacent individual regions A1. Additionally, in the step illustrated in FIG. 5A, openings 20Y are formed in each individual region A1 of the metal plate 50. The openings 20Y define extensions 33, each of which continuously extends from the connection end portion of the corresponding inner lead 30 in a direction opposite to the die pad 23. As illustrated in FIG. 5B, each inner lead 30 and the corresponding extension 33 are formed integrally and leveled on the same plane. The openings 20X, 20Y may be formed, for example, by stamping predetermined portions out of the metal plate 50 through the pressing process. Alternatively, the openings 20X, 20Y may be formed, for example, by an etching process.

Figure 6A:
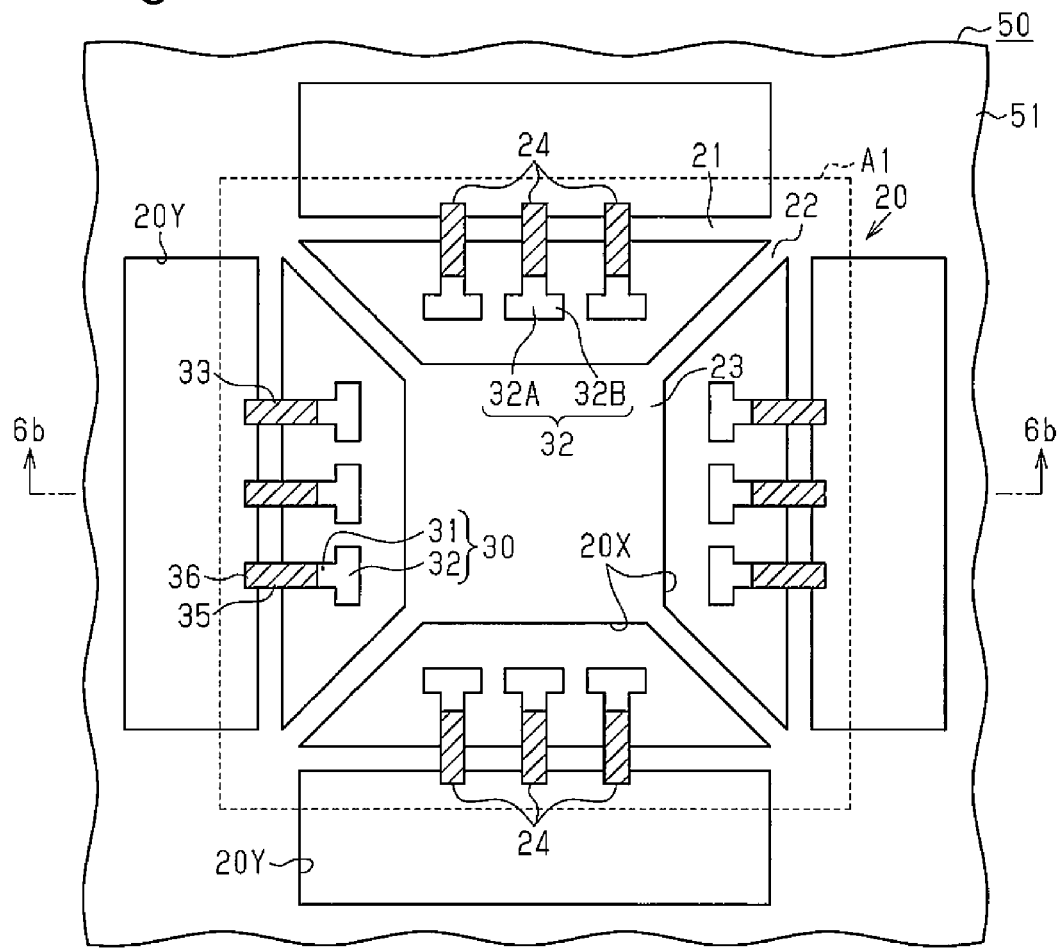
FIG. 6A is a schematic plan view illustrating the process for manufacturing the lead frame.
Figure 6B:
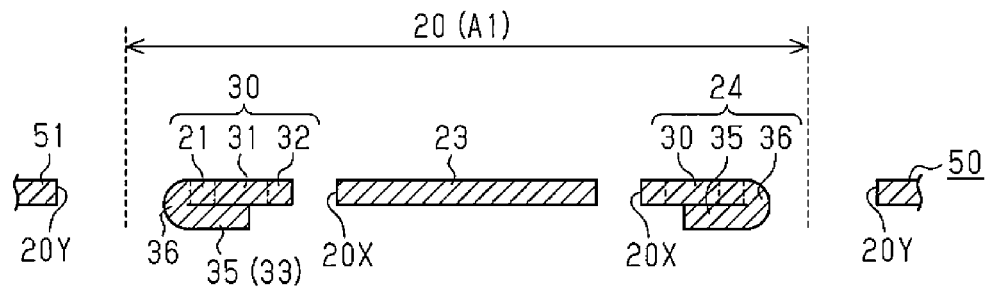
FIG. 6B is a schematic cross-sectional view of the lead frame taken along line 6b-6b in FIG. 6A, where

Then, each extension 33 is bent by approximately 180 degrees in the direction indicated by the arrow in FIG. 5B (downward). That is, a bending process is performed so that the lower surface of each extension 33 is overlapped with the lower surface of the corresponding inner lead 30. Through the bending, as illustrated in FIGS. 6A and 6B, a portion of each extension 33 is overlapped with the lower surface of the corresponding inner lead 30 to form an external connection terminal 35. In this manner, when the extension 33 undergoes the bending process, the inner lead 30, the external connection terminal 35, and the bent portion 36 are formed integrally in the lead 24. The bending process may be performed, for example, by the pressing process with use of a die. Through the above manufacturing steps, the lead frame 20 is manufactured in each individual region A1.

The process for manufacturing the semiconductor device 40 will now be described.

Figure 7A:
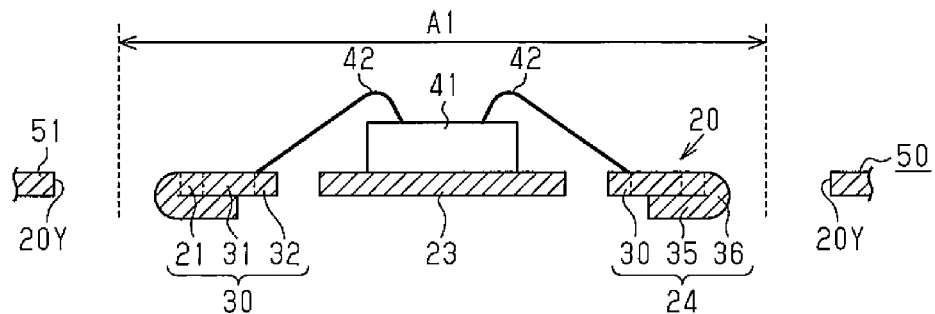
FIGS. 7A and 7B are schematic cross-sectional views illustrating the process for manufacturing the semiconductor device of FIG. 3.

In the step illustrated in FIG. 7A, a semiconductor element 41 is mounted on the die pad 23 of each lead frame 20. Then, the electrode terminals of each semiconductor element 41 are electrically connected to the inner leads 30 by the metal wires 42, respectively. Consequently, the semiconductor elements 41 are assembled to the lead frames 20, respectively. Here, before the semiconductor 41 is mounted on the die pad 23, a plating process may be performed on the surface of the lead frame 20 (e.g., surface of the die pad 23 and surfaces of the leads 24) to form a plating layer. In one example, Ni plating and Au plating are sequentially performed in the plating process. In another example, Ag plating is performed in the plating process. However, the plating process is not limited to such examples.

Figure 7B:
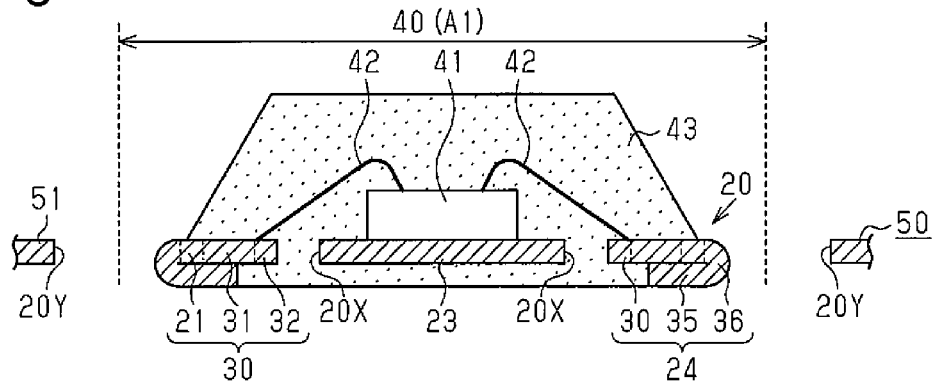

In the step illustrated in FIG. 7B, the encapsulation resin 43 is formed to encapsulate the semiconductor element 41, the metal wires 42, and the like. The encapsulation resin 43 covers the inner leads 30, the external connection terminals 35 (except lower surfaces), and the die pad 23. More specifically, the encapsulation resin 43 covers the lower surface of each inner lead 30, which is exposed from the external connection terminal 35. Thus, the entire surface of the distal portion 32 of each inner lead 30 is covered by the encapsulation resin 43. Consequently, the distal portions 32 are caught in the encapsulation resin 43. Although not particularly illustrated in the drawings, molds including an upper mold and a lower mold may be used to form the encapsulation resin 43. The structure illustrated in FIG. 7A is placed on the lower mold. The structure is held between the upper mold and the lower mold. While an insulative resin is injected from a mold gate (not illustrated) into the corresponding individual region A1, the structure is heated and pressed. The encapsulation resin 43 may be a mold resin formed, for example, by transfer molding, compression molding, injection molding, or the like.

Subsequently, the dambar 21 is cut apart at certain locations, for example, by the pressing process or the like, so that each lead 24 becomes electrically isolated. Through the manufacturing steps, the semiconductor device 40 is manufactured in each individual region A1. Then, the metal plate 50 is cut along the individual regions A1 using a dicing saw or the like and singulated into individual semiconductor devices 40.

The first embodiment has the advantages described below.

(1) Each lead 24 is partially bent so that the lead 24 forms the shape of an anchor. Since the lead 24 forms the shape of an anchor by the simple bending process, the processing time is short compared to when the shape of an anchor is formed by wet etching. Additionally, the shape of an anchor may be inexpensively formed. Further, compared to when the lead 24 undergoes the pressing process to form a crushed portion (shape of an anchor), a small stress is applied to the lead 24 when bending the extension 33. This appropriately limits deformation of the lead 24.

(2) Each extension 33, which is formed integrally and leveled with the corresponding inner lead 30, is bent downward by approximately 180 degrees. This forms the external connection terminal 35, which is overlapped with the inner lead 30. Thus, the inner lead 30 exposed from the external connection terminal 35 (shape of an anchor) has the same thickness as the metal plate 50. The portion in which the external connection terminal 35 overlaps the inner lead 30 is approximately twice as thick as the metal plate 50. Thus, the thicknesswise dimensions may be accurately controlled at the anchor-shaped portion of the lead 24 and other portions of the lead 24.

(3) Each external connection terminal 35 has the same thickness as the metal plate 50. This reduces variations in the thickness (depth) of a step formed by the shape of an anchor (distal portion 32) and the external connection terminal 35.

(4) The upper surface of each inner lead 30 and the lower surface of each external connection terminal 35 are formed using the same surface (upper surface) of the metal plate 50. This maintains the flatness of the upper surface of the inner lead 30 and the flatness of the lower surface of the external connection terminal 35.

(5) The upper surface of each external connection terminal 35 is overlapped with the lower surface of the corresponding inner lead 30. Thus, in the overlapped portion of the inner lead 30 and the external connection terminal 35, the lead 24 is approximately twice as thick as the metal plate 50. This improves the heat conductivity and heat dissipation of the lead 24.

(6) The bent portions 36 are exposed from the encapsulation resin 43. Thus, it may be easily checked whether or not the solder is joined to the lower surfaces of each external connection terminal 35 and each bent portion 36.

The first embodiment may be modified as follows.

Figure 8A:
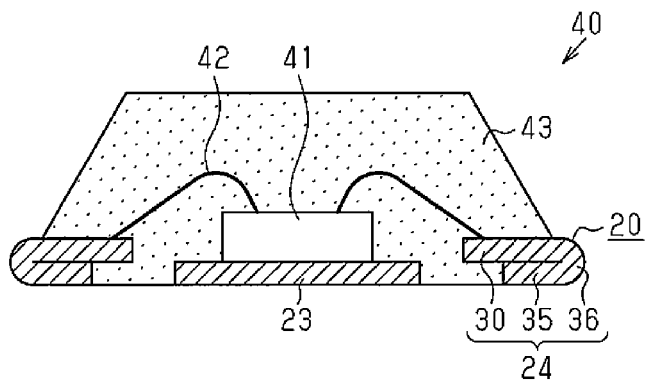
FIGS. 8A and 8B are schematic cross-sectional views each illustrating a semiconductor device including a modified example of a lead frame.
Figure 8B:
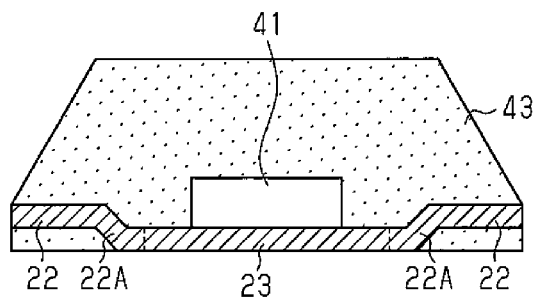

As illustrated in FIG. 8A, the die pad 23 may be formed at a lower position than the inner leads 30. For example, the die pad 23 and the external connection terminals 35 may be substantially formed on the same plane. In this case, the lower surface of the die pad 23 is exposed from the encapsulation resin 43. When the die pad 23 is formed at a lower position than the inner leads 30, the distance may be shortened between the upper surface of the semiconductor element 41, which is mounted on the die pad 23, and the upper surface of each inner lead 30. This improves the bonding properties of the metal wires 42 when connecting the semiconductor element 41 and the inner leads 30. As illustrated in FIG. 8B, the position of the die pad 23 may be adjusted in the thicknesswise direction by bending a portion (e.g., intermediate portion) of each support bar 22, which supports the die pad 23, to form a bent portion 22A.

Figure 9A:
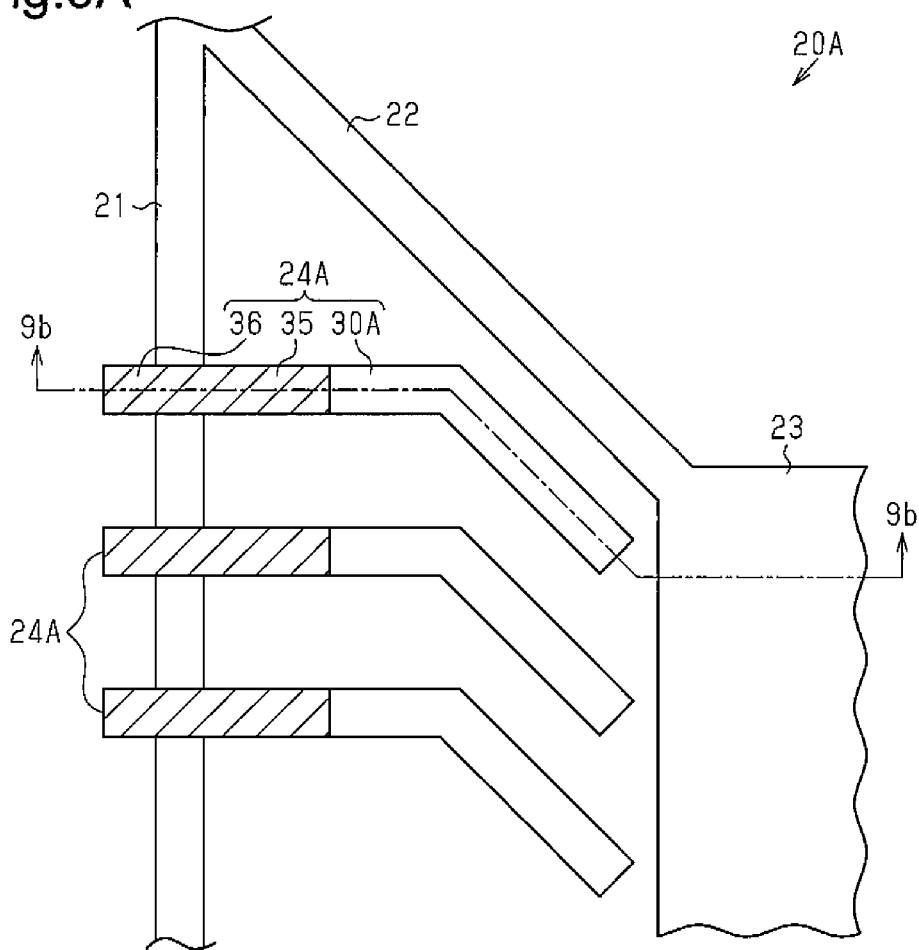
FIG. 9A is a partially enlarged plan view of another modified example of a lead frame.
Figure 9B:
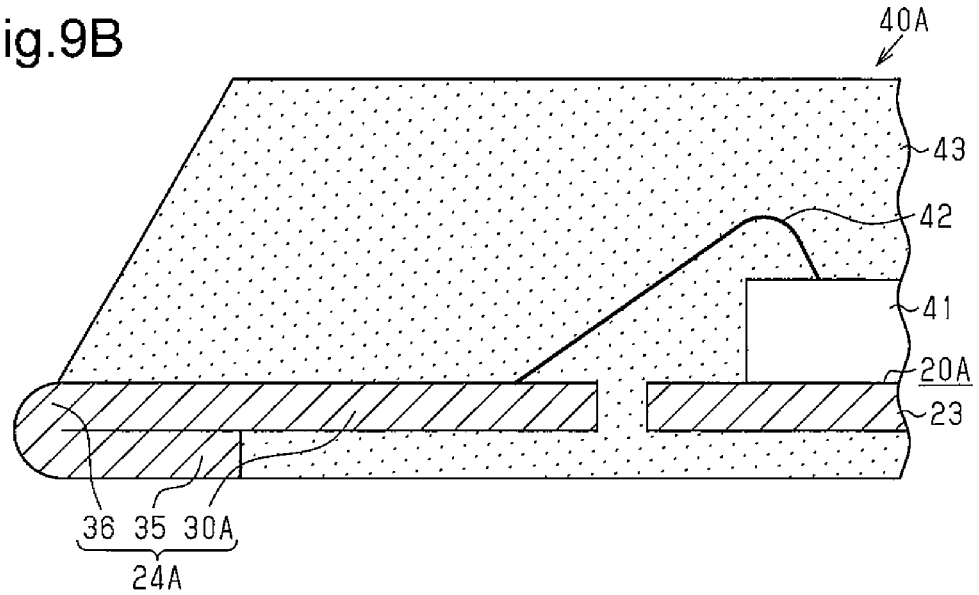
FIG. 9B is a partially enlarged cross-sectional view of a semiconductor device including the lead frame of FIG. 9A taken along line 9b-9b in FIG. 9A.

As illustrated in FIGS. 9A and 9B, a lead frame 20A may be used. The lead frame 20A includes leads 24A, each of which is relatively long (e.g., approximately 1.5 to 2.0 mm) in the longitudinal direction (direction extending toward the die pad 23). In this case, in the same manner as the first embodiment, a portion of each lead 24A is bent to form an external connection terminal 35. In this structure, as illustrated in FIG. 9A, the leads 24A may each include an inner lead 30A that is bent, for example, at an obtuse angle in a plan view.

When the long leads 24A undergo the pressing process so that the distal portion of each lead 24A forms a crushed part, the leads 24A would be deformed into a twisted shape or the like. That is, when leads are long, the leads are significantly deformed resulting from the pressing process. In this regard, in the present modified example, each lead 24A is partially bent to form the shape of an anchor in the distal portion of the lead 24A (distal portion of the inner lead 30A exposed from the external connection terminal 35). This effectively limits the deformation of the leads 24A. Additionally, as illustrated in FIG. 9B, in the modified example of a semiconductor device 40A including the lead frame 20A, the encapsulation resin 43 covers the entire surface of the distal end of each inner lead 30A exposed from the corresponding external connection terminal 35. Consequently, the distal portions are caught in the encapsulation resin 43. Thus, the present modified example also has the same advantages as (1) to (6) of the first embodiment.

In the first embodiment, the distal portion 32 of each inner lead 30 is set to be wider than the other portion (extension 31 and the like) of the inner lead 30 (refer to FIG. 1). More specifically, the distal portion 32 of each inner lead 30 includes a projection 32B. Instead, for example, as illustrated in FIG. 9A, the distal portion of each inner lead 30A may be as wide as the other portion of the inner lead 30A. That is, the projections 32B may be omitted.

Second Embodiment

A second embodiment will now be described with reference to FIGS. 10 to 12C. The second embodiment differs from the first embodiment in that a semiconductor device 40B includes a lead frame 20B instead of the lead frame 20. Here, the description will focus on the differences from the first embodiment. The same reference characters are given to those components that are the same as the corresponding components illustrated in FIGS. 1 to 9B. Such components will not be described in detail.

Figure 10:
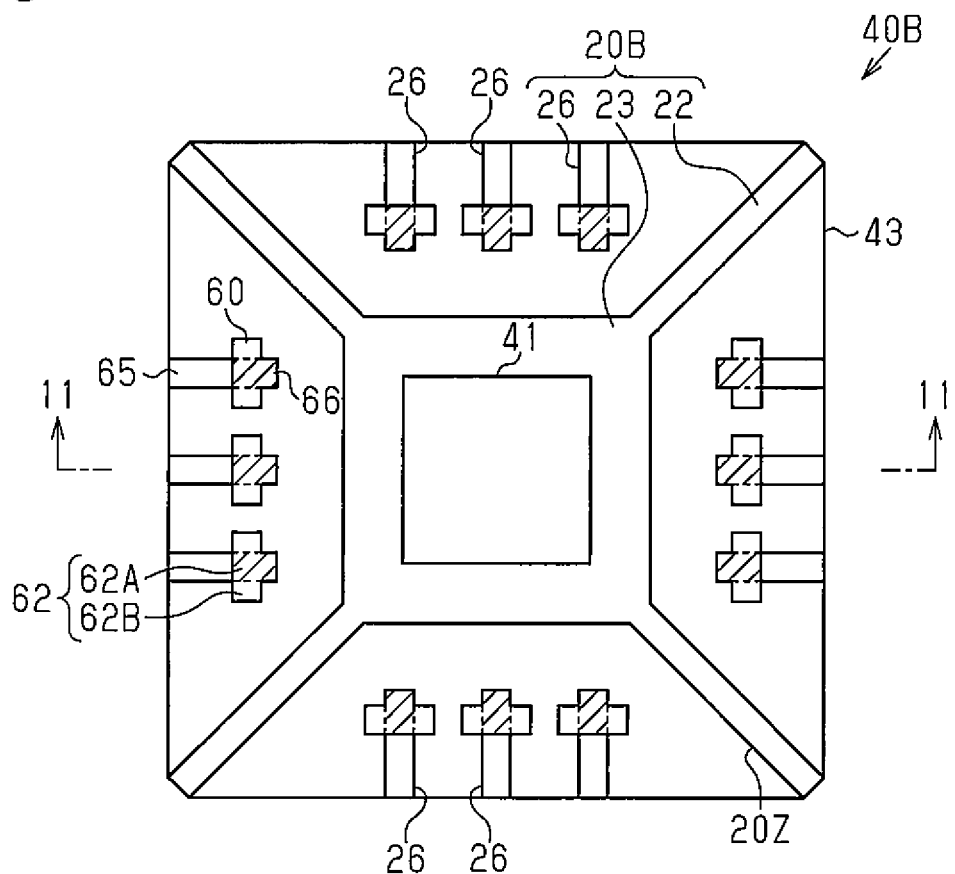
FIG. 10 is a schematic plan view of a semiconductor device including a second embodiment of a lead frame and illustrating the semiconductor device of FIG. 11 as viewed from above.
Figure 11:
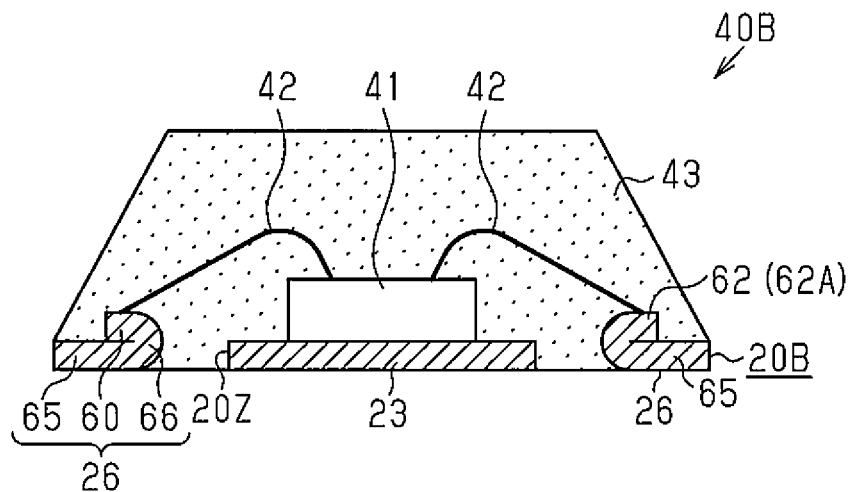
FIG. 11 is a schematic cross-sectional view illustrating the semiconductor device of FIG. 10.

FIGS. 10 and 11 each illustrate the semiconductor device 40B, which is of a QFN type. The semiconductor device 40B includes the lead frame 20B. As illustrated in FIG. 10, the lead frame 20B includes the support bars 22, the die pad 23, and leads 26. The support bars 22 function as a frame. The material of the support bars 22, the die pad 23, and the leads 26 may be, for example, Cu, a Cu-based alloy, Fe—Ni, or an Fe—Ni-based alloy.

The leads 26 surround the die pad 23. Each lead 26 is separated from the die pad 23. For example, the leads 26 are laid out in a comb teeth-like arrangement and extend from an outer surface of the semiconductor device 40B toward the die pad 23.

As illustrated in FIG. 11, each lead 26 includes an inner lead 60 and an external connection terminal 65. The inner lead 60 is electrically connected by a metal wire 42 to an electrode terminal of the semiconductor element 41 mounted on the die pad 23. The external connection terminal 65 is electrically connected to a wire of a mounting board, such as, a motherboard. Additionally, each lead 26 includes a bent portion 66. The bent portion 66 includes one end connected to the inner lead 60 and the other end connected to the external connection terminal 65. The inner lead 60, the external connection terminal 65, and the bent portion 66 are formed integrally.

Each external connection terminal 65 is, for example, tetragonal in a plan view. The external connection terminal 65 includes a connection end portion at a position near the die pad 23. The connection end portion of the external connection terminal 65 is connected to the bent portion 66. The bent portion 66 is formed by bending a portion of the lead 26 by approximately 180 degrees. For example, the bent portion 66 is generally U-shaped in a cross-sectional view. Thus, the outer surface of the bent portion 66 is curved.

As illustrated in FIG. 10, the inner leads 60 each include a wide portion 62, which is wider than the corresponding external connection terminal 65. Each wide portion 62 includes a central part 62A and projections 62B projecting from two laterally opposite ends of the central part 62A in the widthwise direction of the corresponding inner lead 60 (i.e., parallel to the side of the die pad 23 adjacent to the inner lead 60).

As illustrated in FIG. 11, each inner lead 60 includes a lower surface that faces to and is parallel to the upper surface of the corresponding external connection terminal 65. For example, the lower surface of the inner lead 60 is overlapped with the upper surface of the external connection terminal 65. In the present example, the lower surface of the central part 62A of the inner lead 60 is overlapped with the upper surface of the external connection terminal 65. Thus, the projections 62B each include a lower surface exposed from the external connection terminal 65 (refer to FIG. 10). The lower surface of the inner lead 60 (central part 62A) is overlapped and in planar contact with the upper surface of the external connection terminal 65, for example, over a range from the connection end portion of the external connection terminal 65, which is located adjacent to the die pad 23, to a longitudinally intermediate portion of the external connection terminal 65. Thus, the upper surface of the external connection terminal 65 is partially exposed from the inner lead 60. That is, the external connection terminal 65 includes an open end portion that is located at an opposite end of the external connection terminal 65 from the connection end portion. The open end portion is exposed from the inner lead 60.

In this manner, each lead 26 is folded upward from the connection end portion of the external connection terminal 65, which is located at the position near the die pad 23. Consequently, the lower surface of the inner lead 60 is overlapped with the upper surface of the external connection terminal 65. Thus, the external connection terminal 65 has the same thickness as the inner lead 60. The thickness of each of the external connection terminal 65 and the inner lead 60 may be set to be, for example, approximately 0.1 to 0.2 mm.

The die pad 23 is formed on substantially the same plane as the external connection terminals 65. Thus, the die pad 23 is located at a lower position than the inner leads 60. The semiconductor element 41 is mounted on the die pad 23. The electrode terminals of the semiconductor element 41 are connected to the inner leads 60 by the metal wires 42, respectively.

Additionally, as illustrated in FIG. 10, the lead frame 20B includes openings 20Z. The openings 20Z define the support bars 22, the die pad 23, and the leads 26. The openings 20Z extend through the lead frame 20B in the thicknesswise direction. In FIG. 10, the hatched lines depict the region of each lead 26 that is folded and overlapped in two layers.

As illustrated in FIG. 11, the encapsulation resin 43 is formed on the leads 26 and the die pad 23 to encapsulate the semiconductor element 41 and the metal wires 42. Also, the openings 20Z of the lead frame 20B are filled with the encapsulation resin 43. The encapsulation resin 43 covers the entire upper surface of each lead 26 (entire upper surface of the inner lead 60, entire upper surface (curved surface) of the bent portion 66, and entire upper surface of the external connection terminal 65 exposed from the inner lead 60) and side surfaces of each external connection terminal 65. Additionally, the encapsulation resin 43 covers side surfaces, an upper surface, and a lower surface of each projection 62B illustrated in FIG. 10. That is, the encapsulation resin 43 covers the entire surface of the projections 62B of each inner lead 60. Thus, each projection 62B is caught in the encapsulation resin 43. In this manner, each lead 26 is bent upward so that the lower surface of each projection 62B of the inner lead 60 is exposed from the external connection terminal 65. Thus, each projection 62B, which is caught in the encapsulation resin 43, has the form of an anchor, which limits dropout of the lead 26.

In the semiconductor device 40B, the lower surface of each external connection terminal 65 is exposed from the encapsulation resin 43. The lower surface of the external connection terminal 35, which is exposed from the encapsulation resin 43, is electrically connected by a solder or the like to a wire of the mounting board, such as, a motherboard. Additionally, in the semiconductor device 40B, the lower surface of the die pad 23 is exposed from the encapsulation resin 43. For example, the lower surface of each external connection terminal 65 and the lower surface of the die pad 23 are generally flush with the lower surface of the encapsulation resin 43.

The process for manufacturing the lead frame 20B will now be described.

Figure 12A:
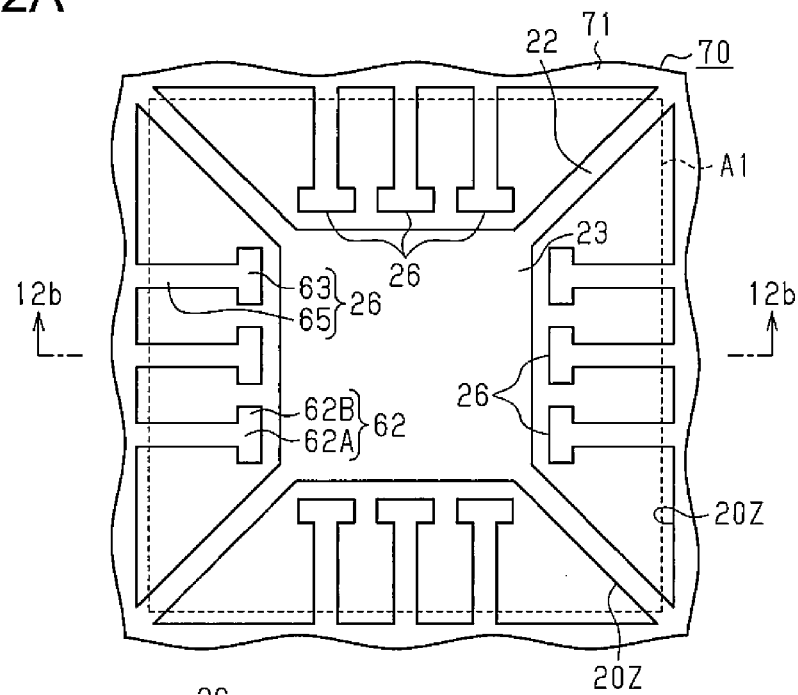
FIG. 12A is a schematic plan view illustrating a process for manufacturing the lead frame of FIG. 10.
Figure 12B:
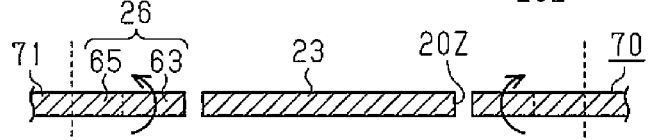
FIG. 12B is a schematic cross-sectional view of the lead frame taken along line 12b-12b in FIG. 12A.

In the step illustrated in FIG. 12A, after a metal plate 70 including the individual regions A1 is prepared, the openings 20Z are formed in each individual region A1. The openings 20Z define the support bars 22, the die pad 23, and the leads 26. The support bars 22 and the leads 26 are connected to an outer frame 71, which is located between adjacent individual regions A1. Each lead 26 includes an external connection terminal 65 extending from the outer frame 71 toward the die pad 23 and an extension 63 extending from the distal end of the external connection terminal 65 toward the die pad 23. The external connection terminals 65 are laid out in a comb teeth-like arrangement. Each extension 63 includes a wide portion 62. As illustrated in FIG. 12B, the external connection terminal 65 and the extension 63 are formed integrally and leveled on the same plane. The openings 20Z may be formed, for example, by the press processing or the etching process.

Figure 12C:
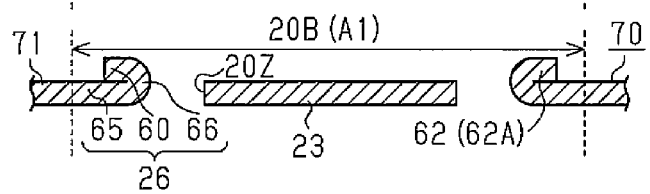
FIG. 12C is a schematic cross-sectional view illustrating the process for manufacturing the lead frame of FIG. 10.

Then, each extension 63 is bent by approximately 180 degrees in the direction indicated by the arrow in FIG. 12B (upward). That is, a bending process is performed so that the upper surface of each extension 63 is overlapped with the upper surface of the corresponding external connection terminal 65. In this case, as illustrated in FIG. 12C, the lower surface of the central part 62A of each wide portion 62 is overlapped with the upper surface of the corresponding external connection terminal 65. Through the bending, a portion of each extension 63 is overlapped with the upper surface of the corresponding external connection terminal 65 to form an inner lead 60. In this manner, when each extension 63 undergoes the bending process, the inner lead 60, the external connection terminal 65, and the bent portion 66 are formed integrally in the lead 26. The bending process may be performed, for example, by the pressing process with use of a die. Through the above manufacturing steps, the lead frame 20B is manufactured in each individual region A1.

Subsequently, the semiconductor element 41 is mounted on the die pad 23 and electrically connected to the inner leads 60. Then, the encapsulation resin 43 is formed to encapsulate the semiconductor element 41 and the like. Consequently, the semiconductor device 40B is manufactured in each individual region A1. Then, the metal plate 70 is cut along the individual regions A1 using a dicing saw or the like. More specifically, the metal plate 70 is cut along the cut position indicated by the broken lines in FIGS. 12A to 12C and singulated into individual semiconductor devices 40B. The singulation separates the support bars 22 and the leads 26 from the outer frame 71.

The second embodiment has the following advantage in addition to advantages (1) to (5) of the first embodiment.

(7) The die pad 23 is formed in a lower position than the inner leads 60. Thus, the distance may be shortened between the upper surface of each inner lead 60 and the upper surface of the semiconductor element 41 mounted on the die pad 23. This improves the bonding properties of the metal wires 42 when connecting the semiconductor element 41 and the inner leads 60.

The second embodiment may be modified as follows.

In the second embodiment, the wide portion 62 of each lead 26, which is located adjacent to the die pad 23, is bent upward by approximately 180 degrees to form an inner lead 60. However, the direction in which the wide portion 62 is bent is not limited to such a direction.

Figure 13:
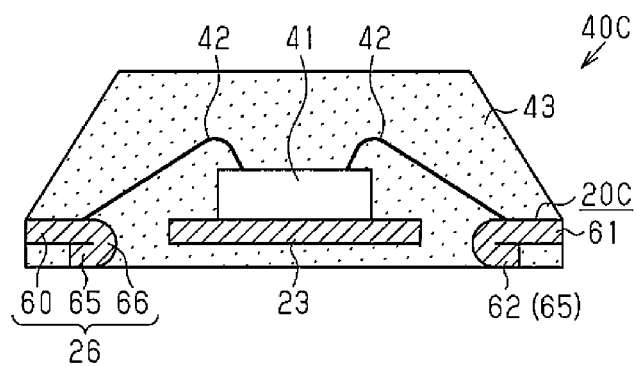
FIG. 13 is a schematic cross-sectional view illustrating a semiconductor device including a modified example of a lead frame.

For example, as illustrated in FIG. 13, each wide portion 62 may be bent downward by approximately 180 degrees to form an external connection terminal 65. In a lead frame 20C, which includes such external connection terminals 65, the downwardly bent wide portions 62 each function as the external connection terminal 65. Each inner lead 60 includes an end portion 61 and a connection end portion that is overlapped with the wide portion 62 (external connection terminal 65). The end portion 61 and the connection end portion are located at opposite sides of the inner lead 60. The end portion 61 (i.e., end portion at the outer surface side of the semiconductor element 40C) functions as an anchor. The encapsulation resin 43 entirely covers the end portion 61 of each inner lead 60. More specifically, each end portion 61, which is caught in the encapsulation resin 43, has the form of an anchor, which limits dropout of the lead 26. This structure also has the same advantages as (1) to (5) of the first embodiment.

Third Embodiment

A third embodiment will now be described with reference to FIGS. 14 to 16C. The third embodiment differs from the first embodiment in that a semiconductor device 40D includes a lead frame 20D instead of the lead frame 20. In particular, the third embodiment differs from the first embodiment in the structure of the die pad 23. Here, the description will focus on the differences from the first embodiment. The same reference characters are given to those components that are the same as the corresponding components illustrated in FIGS. 1 to 9B. Such components will not be described in detail.

Figure 15:
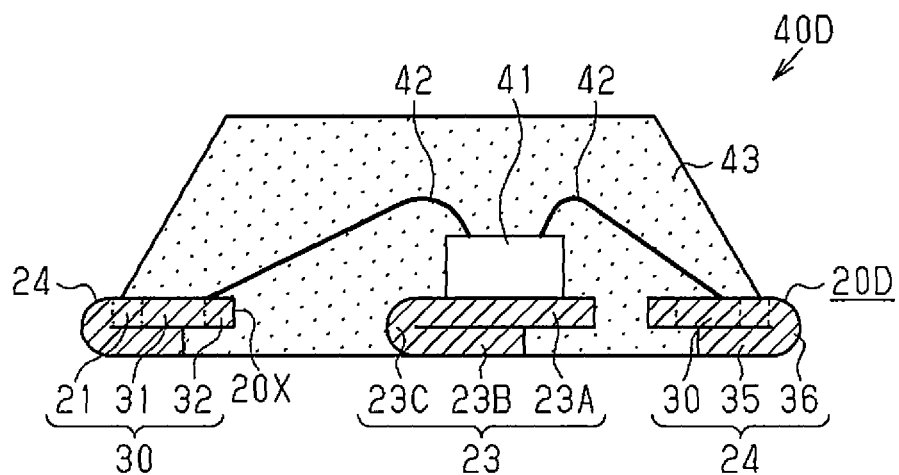
FIG. 15 is a schematic cross-sectional view of the semiconductor device taken along line 15-15 in FIG. 14.

As illustrated in FIG. 15, the die pad 23 includes a die pad portion 23A, on which the semiconductor element 41 is mounted, and an overlapped portion 23B, which is overlapped with a part of the die pad portion 23A. The die pad 23 also includes a bent portion 23C. The bent portion 23C includes one end connected to the die pad portion 23A and the other end connected to the overlapped portion 23B. The die pad portion 23A, the overlapped portion 23B, and the bent portion 23C are formed integrally.

The semiconductor element 41 is mounted on an upper surface of the die pad portion 23A. The bent portion 23C is formed by bending a portion of the die pad 23 by approximately 180 degrees. For example, the bent portion 23C is generally U-shaped in a cross-sectional view. Thus, the outer surface of the bent portion 23C is curved.

Figure 14:
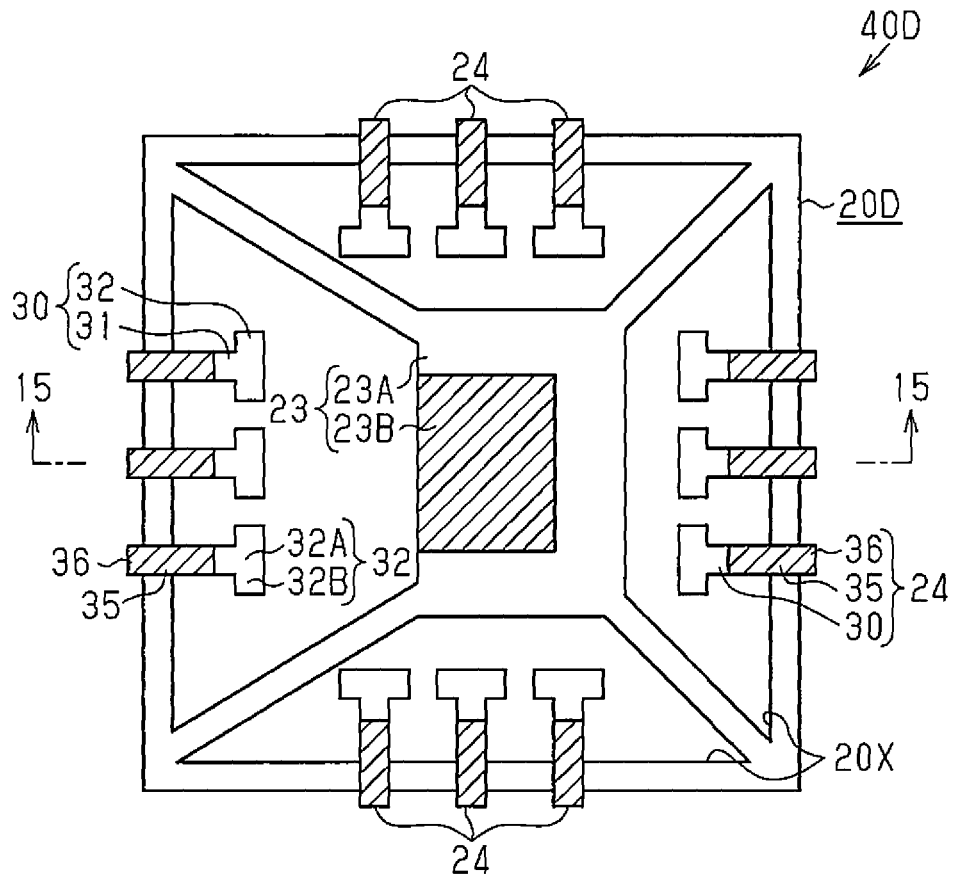
FIG. 14 is a schematic bottom view of a semiconductor device including a third embodiment of a lead frame illustrating the semiconductor device of FIG. 15 as viewed from below.

The overlapped portion 23B includes an upper surface that is overlapped with a lower surface of the die pad portion 23A. As illustrated in FIG. 14, the die pad portion 23A and the overlapped portion 23B are each, for example, tetragonal in a plan view. The overlapped portion 23B has a smaller planar shape than the die pad portion 23A. Thus, the upper surface of the overlapped portion 23B overlapped with a portion of the lower surface of the die pad portion 23A.

In this manner, a portion of the die pad 23 is folded downward at a certain side (left side in the present example) of the die pad portion 23A, which is tetragonal in a plan view. Consequently, the upper surface of the overlapped portion 23B is overlapped with the lower surface of the die pad portion 23A. As illustrated in FIG. 15, for example, the die pad portion 23A is formed in the same plane as the inner leads 30, and the overlapped portion 23B is formed in the same plane as the external connection terminals 35.

In the lead frame 20D, the distance between the die pad 23 and each lead 24 (lead 24 on the left side in FIG. 15) adjacent to the folded side of the die pad portion 23A, which is a portion of the die pad 23 and functions as the overlapped portion 23B, is set to be greater than the distance between the die pad 23 and each lead 24 (e.g., lead 24 on the right side in FIG. 15) adjacent to another side of the die pad portion 23A. That is, the lead frame 20D is asymmetrical at the right and left sides of the die pad 23.

The encapsulation resin 43 is formed on the die pad 23 and the leads 24 to encapsulate the semiconductor element 41 and the metal wires 42. The encapsulation resin 43 covers side surfaces of the overlapped portion 23B and the entire surface of the die pad portion 23A exposed from the overlapped portion 23B. Thus, the die pad portion 23A, which is exposed from the overlapped portion 23B, is caught in the encapsulation resin 43. In this manner, the die pad 23 is bent downward so that the lower surface of the die pad portion 23A is partially exposed from the overlapped portion 23B. Thus, the die pad portion 23A, which is caught in the encapsulation resin 43, has the form of an anchor, which limits dropout of the die pad 23.

In the semiconductor device 40D, the lower surface of each external connection terminal 35 is exposed from the encapsulation resin 43, and the lower surface of the overlapped portion 23B of the die pad 23 is exposed from the encapsulation resin 43. For example, the lower surface of each external connection terminal 35 and the lower surface of the overlapped portion 23B are generally flush with the lower surface of the encapsulation resin 43.

The process for manufacturing the lead frame 20D will now be described.

Figure 16A:
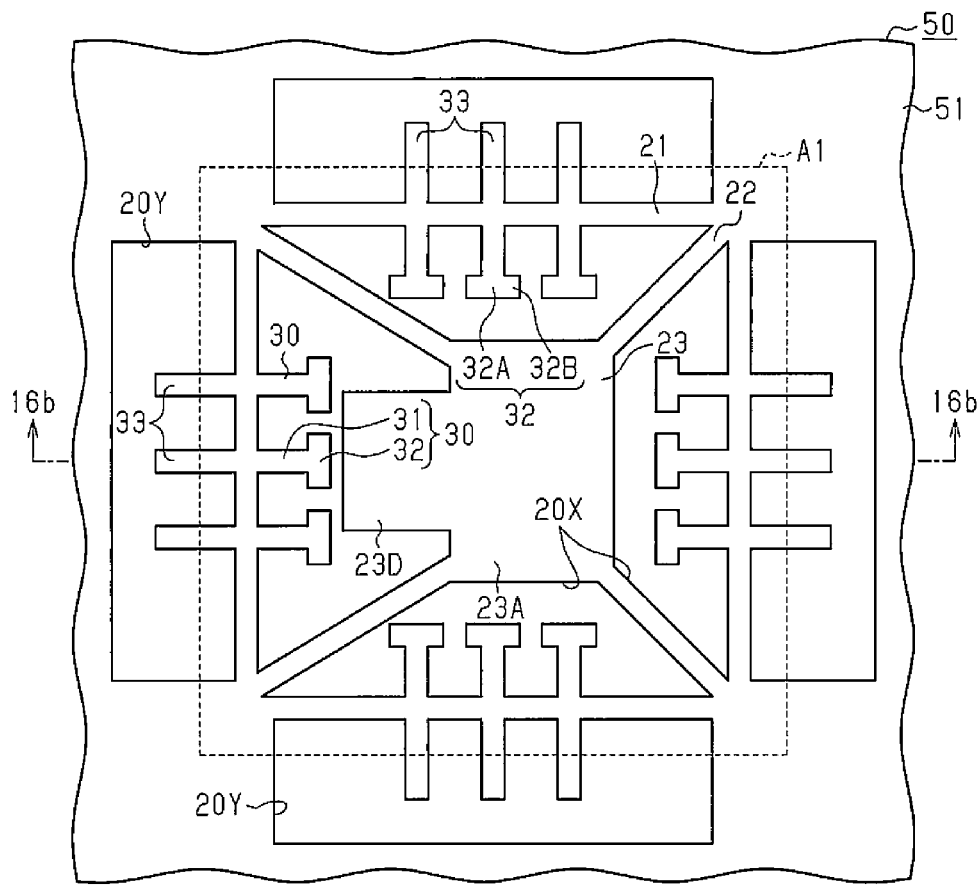
FIG. 16A is a schematic plan view illustrating a process for manufacturing the lead frame of FIG. 15.
Figure 16B:
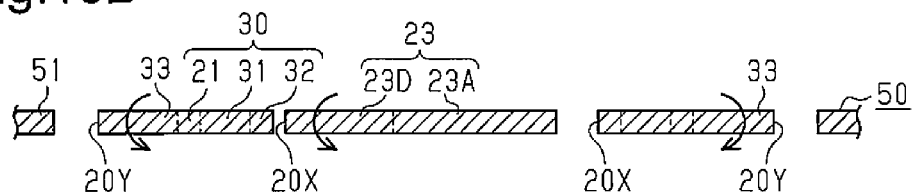
FIG. 16B is a schematic cross-sectional view illustrating the process for manufacturing the lead frame taken along line 16b-16b in FIG. 16A.

In the step illustrated in FIG. 16A, after the metal plate 50 including the individual regions A1 is prepared, in the same manner as the step illustrated in FIG. 5A, the openings 20X, 20Y are formed in each individual region A1. The openings 20X define the die pad 23. The die pad 23 includes the die pad portion 23A and a projection 23D projecting sideward from a certain side (left side in FIG. 16A) of the die pad portion 23A. As illustrated in FIG. 16B, the die pad portion 23A and the projection 23D are formed integrally and leveled on the same plane.

Figure 16C:
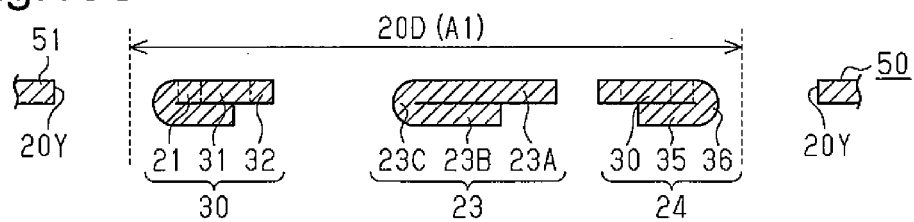
FIG. 16C is a schematic cross-sectional view illustrating the process for manufacturing the lead frame of FIG. 15.

Then, the projection 23D is bent by approximately 180 degrees in the direction indicated by the arrow in FIG. 16B (downward). That is, the bending process is performed so that the lower surface of the projection 23D is overlapped with the lower surface of the die pad portion 23A. Through the bending, as illustrated in FIG. 16C, a portion of the projection 23D is overlapped with the lower surface of the die pad portion 23A to form an overlapped portion 23B. In this manner, the projection 23D undergoes the bending process to form the overlapped portion 23B. Additionally, in this step, in the same manner as the steps illustrated in FIGS. 6A and 6B, each extension 33 undergoes the bending process to form an external connection terminal 35. The bending process may be performed, for example, by the pressing process with use of a die. Through the above manufacturing steps, the lead frame 20D is manufactured in each individual region A1.

Subsequently, the semiconductor element 41 is mounted on the die pad portion 23A and electrically connected to the inner leads 30. Then, the encapsulation resin 43 is formed to encapsulate the semiconductor element 41 and the like. Consequently, the semiconductor device 40D is manufactured in each individual region A1.

The third embodiment has the following advantages in addition to (1) to (6) of the first embodiment.

(8) A portion (projection 23D) of the die pad 23 is bent downward by approximately 180 degrees to form the overlapped portion 23B. This allows the die pad portion 23A, which is caught in the encapsulation resin 43, to function as an anchor, which limits dropout of the die pad 23.

(9) The die pad 23 is bent so that the upper surface of the overlapped portion 23B is overlapped with the lower surface of the die pad portion 23A. The portion of the die pad 23 in which the die pad portion 23A overlaps with the overlapped portion 23B is approximately twice as thick as the metal plate 50. This improves the heat conductivity and heat dissipation of the die pad 23.

It should be apparent to those skilled in the art that the present invention may be embodied in many other specific forms without departing from the scope of the invention. Particularly, it should be understood that the present invention may be embodied in the following forms.

Figure 17A:
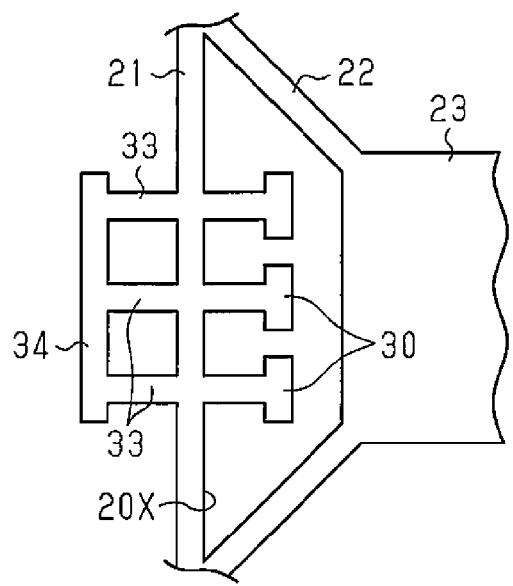
FIGS. 17A to 17C are schematic plan views illustrating a modified example of the process for manufacturing a lead frame.
Figure 17B:
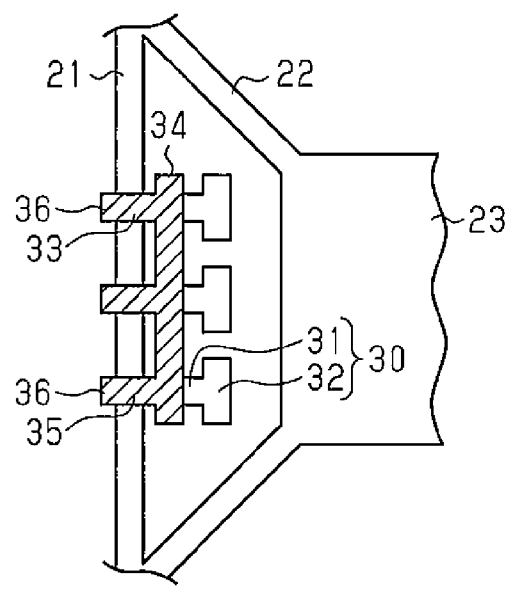
Figure 17C:
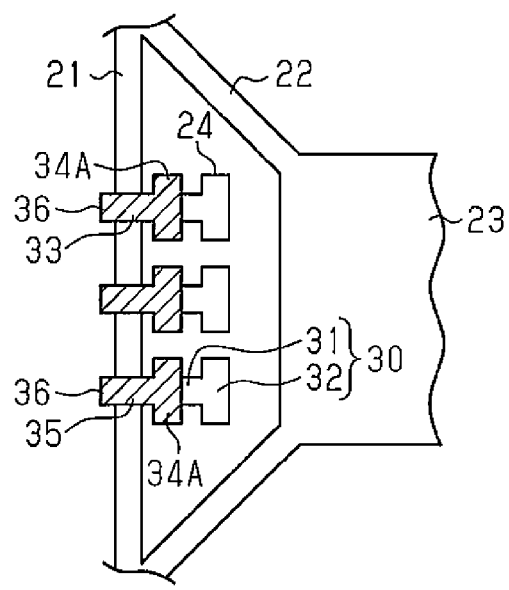

As illustrated in FIG. 17A, during the manufacturing process of the first and third embodiments, a link 34 may be arranged to link adjacent extensions 33. In this case, as illustrated in FIG. 17B, a plurality of (here, three) extensions 33 and the link 34 linking the extensions 33 are bent together downward by approximately 180 degrees. That is, the bending process is performed so that the lower surfaces of the extensions 33 and the lower surface of the link 34 are overlapped with the lower surfaces of the inner leads 30, respectively. When the link 34 is arranged, the area of a bending portion is increased by the area of the link 34. Thus, the bending process may be easily performed on the extensions 33. Subsequently, in the step illustrated in FIG. 17C, the link 34 is cut at locations between each adjacent ones of the external connection terminals 35. This divides the link 34 into a plurality of wide portions 34A. Thus, a wide portion 34A may be easily formed in the distal end of each external connection terminal 35.

Figure 18A:
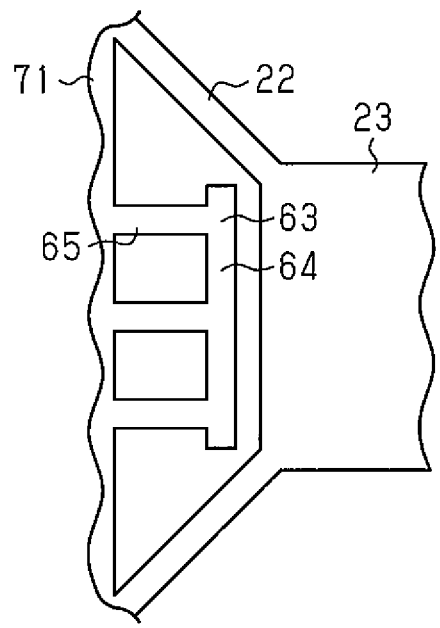
FIGS. 18A to 18C are schematic plan views illustrating another modified example of the process for manufacturing a lead frame.
Figure 18B:
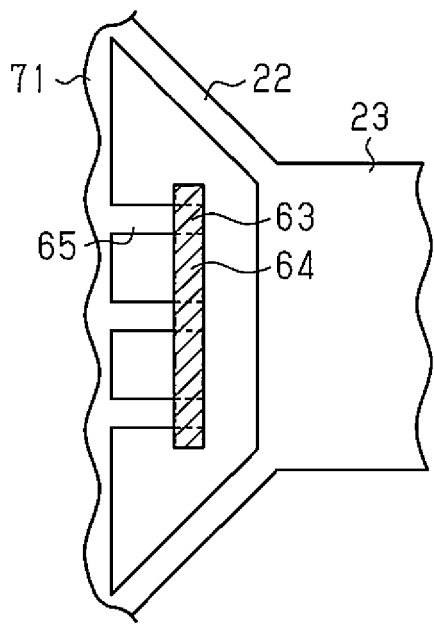
Figure 18C:
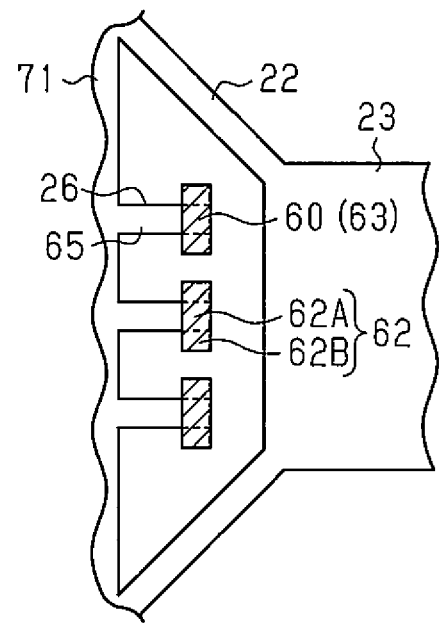

As illustrated in FIG. 18A, during the manufacturing of the second embodiment, a link 64 may be arranged to link adjacent extensions 63. In this case, as illustrated in FIG. 18B, a plurality of (here, three) extensions 63 and the link 64 linking the extensions 63 are bent together upward by approximately 180 degrees. When the link 64 is arranged, the area of a bending portion is increased by the area of the link 64. Thus, the bending process may be easily performed on the extensions 63. Subsequently, the link 64 is cut at locations between each adjacent ones of the extensions 63. This divides the link 64 into a plurality of wide portions 62. Thus, as illustrated in FIG. 18C, the inner leads 60 respectively including the wide portions 62 may be easily formed.

The embodiments and the modified examples may be combined. For example, the die pad 23 of the third embodiment, that is, the die pad 23 including the die pad portion 23A and the overlapped portion 23B, may be applied to the lead frame 20B of the second embodiment. Also, a single lead frame may include multiple kinds of leads including the leads 24 of the first embodiment and the leads 26 of the second embodiment.

Figure 19A:
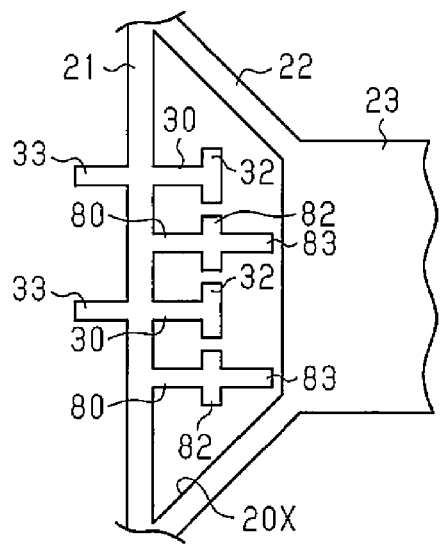
FIGS. 19A and 19B are schematic plan views illustrating the process for manufacturing a modified example of a lead frame.
Figure 19B:
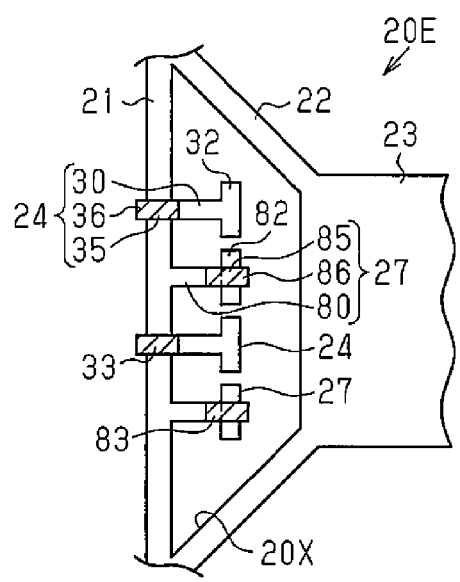

For example, as illustrated in FIG. 19B, a single lead frame 20E may include two kinds of leads as denoted by reference numerals 24, 27. The leads 24, 27 are laid out in a comb teeth-like arrangement and extend from the dambar 21 toward the die pad 23. For example, the leads 24 and the leads 27 are alternately arranged in a direction parallel to the side of the die pad 23, that is, along the dambar 21. In the same manner as the first embodiment, each lead 24 includes the inner lead 30 (first inner lead), the bent portion 36 (first bent portion), and the external connection terminal 35 (first external connection terminal). The inner lead 30 includes the distal portion 32 (first distal portion), which is adjacent to the die pad 23, and the connection end portion, which is located at an opposite end of the inner lead 30 from the distal portion 32. The bent portion 36 is connected to the connection end portion of the inner lead 30. In the same manner as the first embodiment, it is preferred that the distal portion 32 of the inner lead 30 include a wide projection. The external connection terminal 35 is formed by bending a portion of the lead 24 downward from the connection end portion of the inner lead 30 at the bent portion 36. Each lead 27 includes an inner lead 80 (second inner lead) including a distal portion 82 (second distal portion) adjacent to the die pad 23. It is preferred that the distal portion 82 of each inner lead 80 include a wide projection. Each lead 27 also includes a bent portion 86 (second bent portion) connected to the distal portion 82 of the inner lead 80 and an external connection terminal 85 (second external connection terminal). The external connection terminal 85 is formed by bending a portion of the lead 27 downward from the distal portion 82 of the inner lead 80 at the bent portion 86. The upper surface of the external connection terminal 85 is overlapped with the inner lead 80. The process for manufacturing the leads 24, 27 will now be briefly described.

As illustrated in FIG. 19A, the inner leads 30, 80 extending from the dambar 21 toward the die pad 23 are formed in a comb teeth-like arrangement. The inner leads 30, 80 are alternately arranged. Each inner lead 30 includes a wide distal portion 32. Each inner lead 80 includes a wide distal portion 82. Each extension 83 is formed integrally with the corresponding inner lead 80 and extends from the distal portion of the inner lead 80 toward the die pad 23. The inner lead 80 and the extension 83 are leveled on the same plane. In the same manner, each extension 33 is formed integrally with the corresponding inner lead 30 and extends from the connection end portion of the inner lead 30 in a direction opposite to the die pad 23. The inner lead 30 and the extension 33 are leveled on the same plane.

Then, each extension 83 is bent downward by approximately 180 degrees. That is, the bending process is performed so that the lower surface of the extension 83 is overlapped with the lower surface of the corresponding inner lead 80. In the same manner, each extension 33 is also bent downward by approximately 180 degrees. That is, the bending process is performed so that the lower surface of the extension 33 is overlapped with the lower surface of the inner lead 30. As a result, as illustrated in FIG. 19B, a portion of each extension 83 is overlapped with the inner lead 80 to form an external connection terminal 85. Also, a portion of each extension 33 is overlapped with the lower surface of the inner lead 30 to form an external connection terminal 35. In this manner, when each extension 83 undergoes the bending process, the inner lead 80, the external connection terminal 85, and the bent portion 86 are formed integrally in the lead 27. Also, when each extension 33 undergoes the bending process, the inner lead 30, the external connection terminal 35, and the bent portion 36 are formed integrally in the lead 24.

Figure 19C:
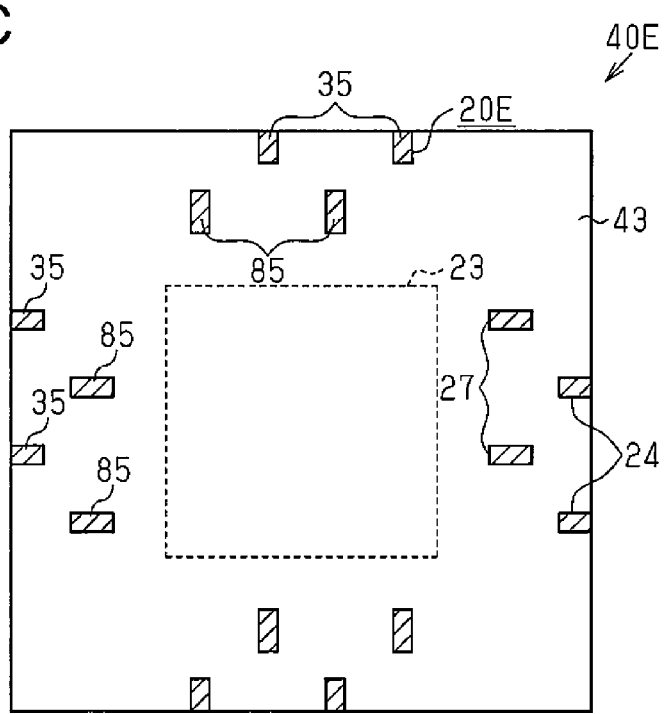
FIG. 19C is a schematic plan view illustrating a semiconductor device including the lead frames of FIGS. 19A and 19B.

As illustrated in FIG. 19C, through the above steps, the semiconductor device 40E is formed using the lead frame 20E including the two kinds of leads 24, 27. In the semiconductor device 40E, two kinds of external connection terminals 35, 85 are arranged in a staggered layout in a plan view. This allows the external connection terminals 35, 85 to be arranged in the semiconductor device 40E at a high density.

Figure 20A:
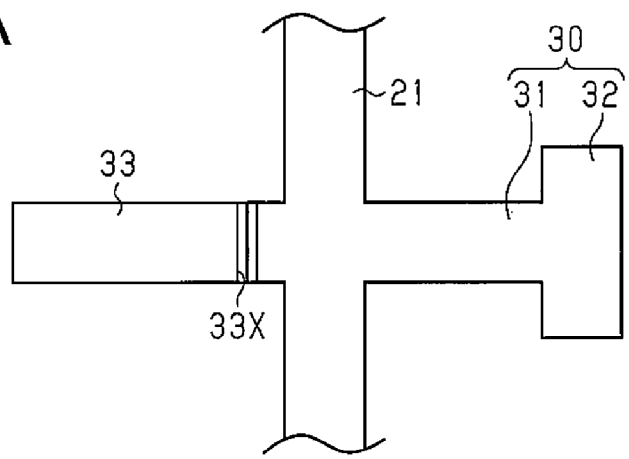
FIG. 20A is a schematic plan view illustrating a modified example of a lead.
Figure 20B:
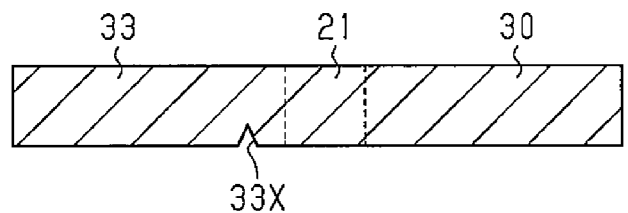
FIG. 20B is a schematic cross-sectional view illustrating the lead of FIG. 20A.

In each of the embodiments and modified examples, before the bending process, a groove may be formed in a bending location. For example, as illustrated in FIGS. 20A and 20B, the bending location of the extension 33 may undergo a V-notch process so that a groove 33X is formed in the extension 33. Although the cross-section of the groove 33X is V-shaped, there is no limit to such a shape. For example, the cross-section of the groove 33X may be tetragonal or U-shaped. The formation of the groove 33X allows the bending process to be easily performed on the extension 33.

In each of the embodiments and modified examples, each of the leads 24, 26, 27 is partially bent so that the upper surface of the corresponding one of the external connection terminals 35, 65, 85 is overlapped and in planar contact with the lower surface of the corresponding one of the inner leads 30, 60, 80. Instead, for example, the upper surface of each of the external connection terminals 35, 65, 85 may be separated from the lower surface of the corresponding one of the inner leads 30, 60, 80 so that a gap is formed between the upper surface and the lower surface. In this case, the gap may be filled with the encapsulation resin 43. However, even in this case, it is preferable to bend a portion of each of the leads 24, 26, 27 so that the upper surface of each of the external connection terminals 35, 65, 85 faces to and is generally parallel to the lower surface of the corresponding one of the inner leads 30, 60, 80.

In each of the embodiments and modified examples, the bent portions 36, 66, 86 are each generally U-shaped in a cross-sectional view. However, the bent portions 36, 66, 86 may each have any cross-sectional shape as long as the shape allows the corresponding one of the leads 24, 26, 27 to be bent by approximately 180 degrees. For example, in a cross-sectional view, the bent portions 36, 66, 86 may each have the form of a generally right angle or be generally V-shaped. That is, the outer surface of each of the bent portions 36, 66, 86 does not have to be curved.

The embodiments and modified examples describe the lead frames 20, 20A to 20E, each of which is used as a substrate of a QFN package, that is, the semiconductor devices 40, 40A to 40E of QFN type. However, there is no limit to such a configuration. The present invention may be applied to a lead frame used as a substrate of a leadless package other than QFN (e.g., SON), that is, a leadless semiconductor device other than QFN.

Figure 21:
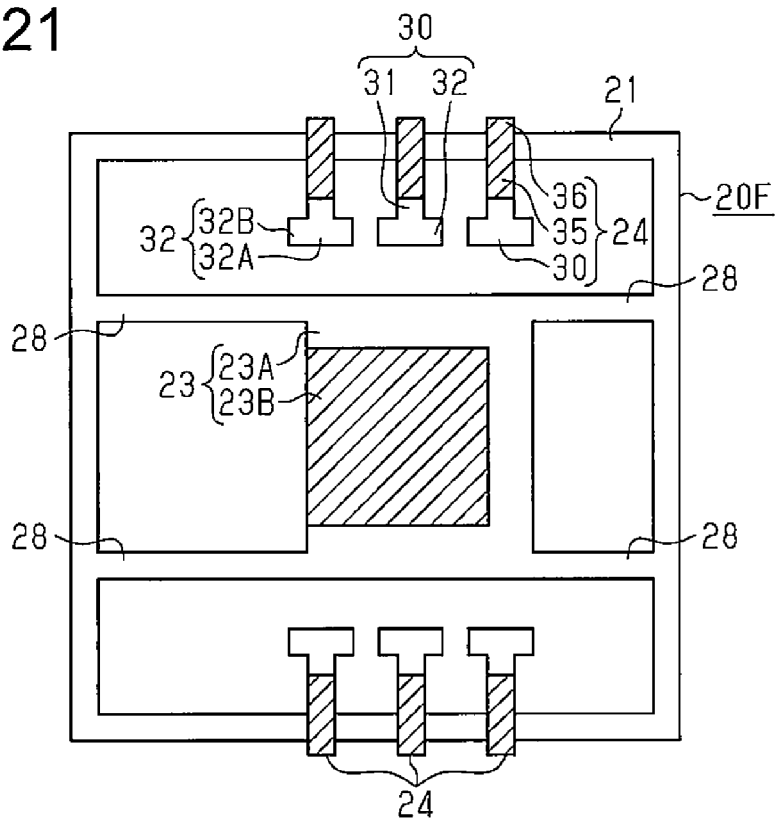
FIG. 21 is a schematic plan view illustrating another modified example of a lead frame.
Figure 22:
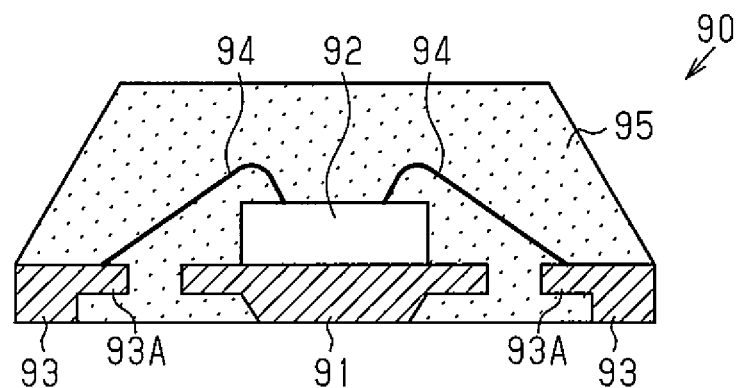
FIG. 22 is a schematic cross-sectional view illustrating a semiconductor device of a related art.

For example, as illustrated in FIG. 21, the lead frame 20D of the third embodiment may be replaced by a lead frame 20F, which is used as a substrate of an SON package. The lead frame 20F will now be described.

The lead frame 20F includes the dambar 21, support bars 28, the die pad 23, and the leads 24. The die pad 23 is supported by four support bars 28, each of which extends from one of two opposing sides (here, left and right sides in FIG. 21) of the dambar 21 having the form of a tetragonal frame in a plan view. In other words, the dambar 21 and the support bars 28 function as a frame that supports the die pad 23. In the same manner as the third embodiment, the die pad 23 includes the die pad portion 23A and the overlapped portion 23B.

Each lead 24 extends from one of two sides of the dambar 21, which are free from the support bars 28, toward the die pad 23. The leads 24 are laid out in a comb teeth-like arrangement. That is, in the lead frame 20F, the leads 24 extend only from two opposing sides (here, upper and lower sides in FIG. 21). Each lead 24 includes the inner lead 30, the external connection terminal 35, and the bent portion 36.

Clauses

This disclosure further encompasses various embodiments described below.

1. A method for manufacturing a lead frame, the method including:
preparing a metal plate;
pressing or etching the metal plate to form a plurality of openings, wherein the openings define a die pad,
a frame that supports the die pad,
a plurality of inner leads that are laid out in a comb teeth-like arrangement and extend from the frame toward the die pad, and
a plurality of extensions extending from the frame in a direction opposite to a direction in which the inner leads extend; and
bending each of the extensions downward so that a lower surface of the extension is overlapped with a lower surface of a corresponding one of the inner leads to form an external connection terminal, which is overlapped with a portion of the lower surface of the inner lead.

2. A method for manufacturing a lead frame, the method including:
preparing a metal plate;
pressing or etching the metal plate to form a plurality of openings, wherein the openings define
a die pad,
a plurality of external connection terminals arranged around the die pad, and
a plurality of extensions respectively extending from distal ends of the external connection terminals toward the die pad, each of the extensions being wider than a corresponding one of the external connection terminals; and
bending each of the extensions upward so that an upper surface of the extension is overlapped with an upper surface of the corresponding one of the external connection terminals to form an inner lead, which is overlapped with a portion of the upper surface of the external connection terminal.

The present examples and embodiments are to be considered as illustrative and not restrictive, and the invention is not to be limited to the details given herein, but may be modified within the scope and equivalence of the appended claims.

The invention claimed is:
1. A lead frame comprising:
a die pad; and
a plurality of leads arranged around the die pad, wherein each of the leads includes
an inner lead that includes a distal portion, adjacent to the die pad, and a connection end portion, located at an opposite end of the inner lead from the distal portion,
a bent portion connected to the connection end portion of the inner lead, and
an external connection terminal connected by the bent portion to the connection end portion of the inner lead and located below the inner lead, the external connection terminal including an upper surface that faces to and is parallel to a lower surface of the inner lead,
the inner lead, the bent portion, and the external connection terminal are formed integrally in each of the leads, and
the upper surface of the external connection terminal is in planar contact with the lower surface of the inner lead in each of the leads.

2. The lead frame according to claim 1, further comprising a frame that supports the die pad, wherein
the leads are laid out in a comb teeth-like arrangement and extend from the frame toward the die pad, and
the upper surface of the external connection terminal is overlapped with a lower surface of the frame in each of the leads.

3. A semiconductor device comprising:
a lead frame according to claim 1;
a semiconductor element mounted on the die pad;
a metal wire that electrically connects the semiconductor element and the inner lead; and
an encapsulation resin that encapsulates the semiconductor element and the metal wire and covers an entire surface of the distal portion of the inner lead,
wherein
the bent portion of each of the leads is exposed from the encapsulation resin.

4. The lead frame according to claim 1, wherein
the inner lead further includes an extension extending from the connection end portion to the distal portion, and
the distal portion is wider than the extension.

* * * * *